United States Patent [19]

Pond

[11] Patent Number: 4,709,210
[45] Date of Patent: Nov. 24, 1987

[54] MAGNETOACOUSTIC PROXIMITY SENSOR

[76] Inventor: Robert J. Pond, 4198 Eastern Rd., Doylestown, Ohio 44230

[21] Appl. No.: 729,658

[22] Filed: May 2, 1985

[51] Int. Cl.[4] .......................... G01B 7/14; G01H 5/00
[52] U.S. Cl. ............................... 324/207; 33/125 W; 340/365 L; 367/127
[58] Field of Search ............ 324/207, 208; 33/125 W; 73/597; 340/365 L; 178/18, 19; 333/148; 367/127, 118

[56] References Cited

U.S. PATENT DOCUMENTS

| | | |
|---|---|---|
| 3,173,131 | 3/1965 | Perucca . |
| 3,898,555 | 8/1975 | Tellerman . |
| 4,028,619 | 6/1977 | Edwards . |
| 4,071,818 | 1/1978 | Krisst ................................. 324/208 |
| 4,121,155 | 10/1978 | Chamuel ............................ 324/207 |
| 4,144,519 | 3/1979 | Chamuel ............................ 324/208 |
| 4,144,574 | 3/1979 | Chamuel ...................... 324/208 X |
| 4,238,844 | 12/1980 | Ueda et al. ......................... 367/117 |
| 4,298,861 | 11/1981 | Tellerman ...................... 340/365 L |
| 4,319,189 | 3/1982 | Cullum, Jr. et al. ................ 324/208 |
| 4,344,068 | 8/1982 | Thompson et al. ............. 340/365 L |
| 4,364,013 | 12/1982 | Castera et al. ................. 324/207 X |
| 4,382,230 | 5/1983 | Gauthier ............................ 324/207 |
| 4,404,523 | 9/1983 | Hughes et al. ..................... 324/207 |
| 4,418,242 | 11/1983 | Kouno ................................. 178/19 |
| 4,482,784 | 11/1984 | Whetstone ........................... 178/19 |
| 4,634,973 | 1/1987 | Murakami et al. ................. 324/207 |

OTHER PUBLICATIONS

Thompson et al., Transducers for a Magnetostrictive Position Sensor, *IBM Technical Disclosure Bulletin*, vol. 22, No. 12, May 1980, pp. 5561–5563.

*Primary Examiner*—Gerard R. Strecker
*Attorney, Agent, or Firm*—Pearne, Gordon, McCoy & Granger

[57] ABSTRACT

A new form of proximity sensor is described which enables sensing of magnetic and/or metallic objects over an extended region of space. The time-varying magnetic field necessary for proximity sensing is provided by a strain wave propagating at acoustic velocity in a waveguide composed of magnetized magnetostrictive material. The propagating strain wave carries with it a disturbance in the magnetic field in the region of the waveguide. A single, elongated sensing coil is located in the same plane as the acoustic waveguide and senses changes in the flux passing through the coil when magnetic and/or metallic objects or targets are present near the waveguide. The spatial location of the targets along the length of the proximity sensor can be determined by measuring the time interval from the initial application of the strain wave until the signal corresponding to the target is induced in the sensing coil. Multiple objects can be sensed by measuring the time interval for each signal. The foregoing abstract is merely a resume of one general application, is not a complete discussion of all principles of operation or applications, and is not to be construed as a limitation on the scope of the claimed subject matter.

13 Claims, 16 Drawing Figures

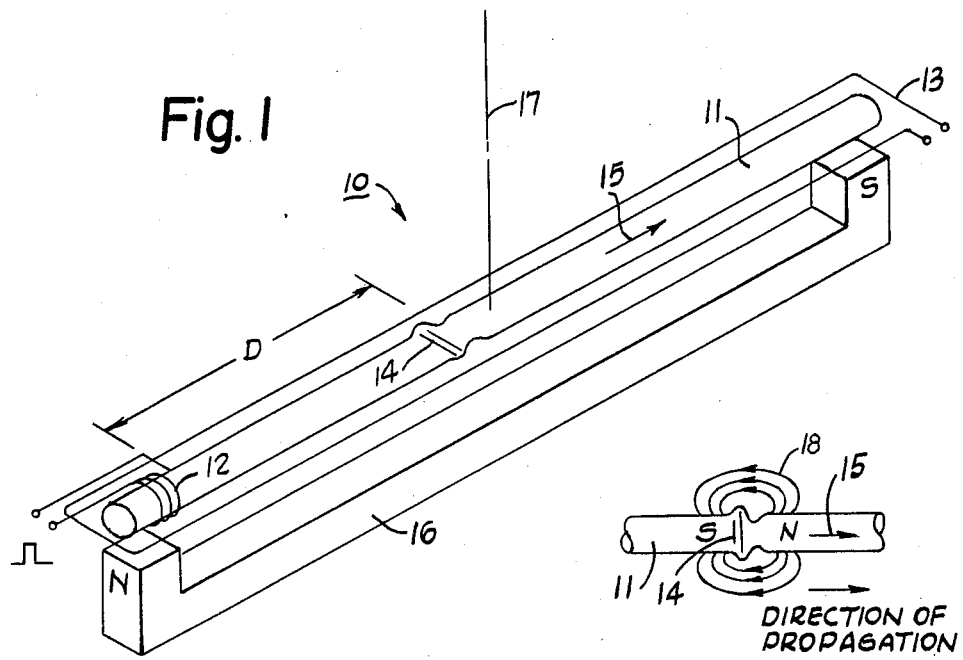
Fig. 1
Fig. 2
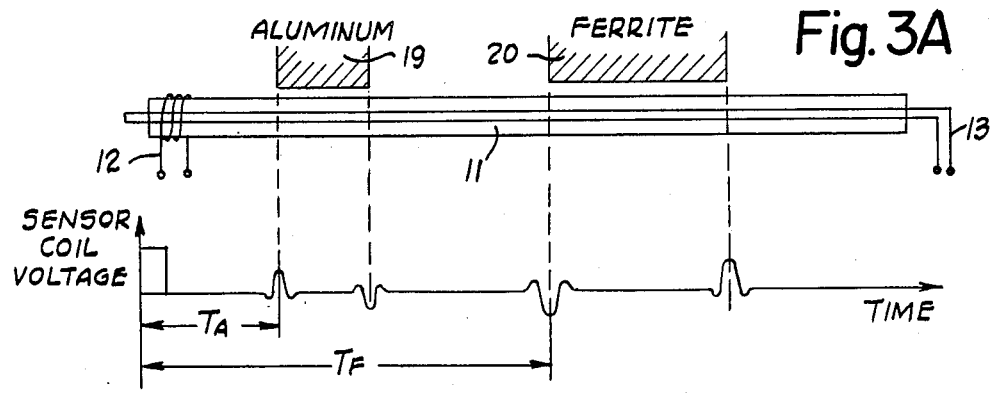
Fig. 3A
Fig. 3B

MAGNETOACOUSTIC PROXIMITY SENSOR

BACKGROUND OF THE INVENTION

Conventional proximity sensors require a time-varying magnetic field which is usually supplied by an oscillator circuit in conjunction with a sensor coil. The change in the magnetic field due to a nearby magnetic object or the change in the losses of the coil due to eddy currents in a nearby metallic object are measured by the oscillator circuit. Of necessity, the proximity sensor only measures the present of objects in the immediate vicinity of the sensor coil. In order to acquire information over an extended region of space, either the sensor must be moved or a multiplicity of sensors must be provided.

Magnetoacoustic devices have been known in the art for some time to provide various sensing and data storage functions. The textbook, *Physical Acoustics*, Volume IA, edited by Mason, summarizes a considerable body of knowledge reating to the theory and application of these devices. U.S. Pat. Nos. 4,298,861 and 3,898,555 to Tellerman use a magnetostrictive wire in conjunction with a movable magnet to indicate the position of a piston in a cylinder or of depressed keys on a keyboard. Others have used the propagating magnetoacoustic wave to sense the position of a movable coil.

These sensors have a number of drawbacks. For example, the concept of Tellerman requires the use of magnets to provide the proper sensing action. Sensing the voltage in a movable pickup coil also limits the possible applications. Furthermore, none of the inventions previously set forth provide for the sensing of arbitrary ferrous and non-ferrous or ferrite objects not having a permanent magnetic field.

SUMMARY OF THE INVENTION

The problem to be solved is how to provide a proximity sensor which will sense a target over an extended region of space without the limitations of the prior art. "Proximity sensor" here describes a sensor capable of sensing ferrous or non-ferrous metals and ferrites and is common usage in the field of industrial controls. This problem is solved by a magnetoacoustic proximity sensor, comprising in combination, an elongated magnetostrictive member having a given length, width, and thickness and wherein the length is long relative to its thickness, an elongated conductive pickup member positioned with the length thereof substantially coextensive with the length of said elongated magnetostrictive member, pulsing means to establish a strain wave and concurrent magnetic field traveling lengthwise through said magnetostrictive member, and detector means connected to said pickup member to detect the presence of a target of flux distorting material adjacent said magnetostrictive member at any distance along the length of said magnetostrictive member by the disturbance of the traveling magnetic field caused by the target.

A highly desirable goal would be to provide a proximity sensor having the ability to sense magnetic and/or metallic objects over an extended region of space at a high rate with no moving parts. This is accomplished by making beneficial use of a unique property of magnetostrictive materials: namely, the interaction of the local magentic field in the material and the local strain. the example below illustrates this concept. When a transducer coil which is placed around one end of a longitudinally magnetized magnetostrictive wire, such as nickel, is energized by a short pulse of current, the local magnetic field in the wire in the region of the coil is briefly disturbed. The disturbance in the magnetic field in the wire alters the state of strain in the wire due to the magnetostrictive property of nickel. This strain, or deformation, created locally under the energizing coil, propagates down the wire at the longitudinal mode sound velocity of about 200,000 inches per second. Associated with this propagating strain wave is a disturbance in the local magnetic field due to magnetostriction (actually the inverse of the transduction process described above). This magnetic disturbance behaves as if it were a dipole magnet propagating within the wire at the sound velocity therein. It is the field of this moving dipole that is used to excite the medium around the wire to perform the proximity sensing function.

The measurement of the response of the system to the propagating exciting field is provided by an elongated conductive pickup member in the form of two coil sides of an extended sensing coil which surrounds the magnetostrictive wire or acoustic waveguide. The wire is arranged to lie in the plane of the coil. This coil detects changes in the flux passing through it by having a voltage induced in it proportional to its rate of change. If there are no proximity targets present and the magnetostrictive wire and the sensing coil are coplanar, there is no net flux change through the coil even though the dipole is propagating and producing a time-varying field at some fixed point along the wire.

When a proximity target is located near the magentostrictive wire, the local magnetic field is disturbed when the dipole passes by. This disturbance changes the total flux passing through the sensing coil, and thereby induces a voltage proportional to the rate of change of the flux. since the sound velocity is approximately constant, the location of the target along the length of the magnetostrictive wire can be uniquely determined by measuring the time interval between the initial application of the strain wave at the end of the wire and the moment the signal appears in the sensing coil. Also, multiple objects placed at different points along the wire can be distinguished as separate since the signals they induce will occur at different times.

The amplitude of the induced signal is larger if the proximity object is nearer to the magnetostrictive wire, so that a relative indication of target-to-wire spacing can be made. furthermore, the sign of the induced voltage for ferrite targets is opposite to that for metal targets, since the flux change is in the opposite direction and thus can be distinguished.

Accordingly, an object of the invention is to provide an elongated proximity sensor to sense the presence of a target anywhere along the length of the sensor.

Another object of the invention is to provide an elongated proximity sensor which is quick-acting and which will detect the presence of a target anywhere along the length of the sensor without any moving parts, using a passive target.

A further object of the invention is to provide a proximity sensor which can detect the difference between metallic and magnetic targets.

Other objects and a fuller understanding of the invention may be had by referring to the following description and claims, taken in conjunction with the accompanying drawing.

BRIEF DESCRIPTION OF THE DRAWINGS

FIG. 1 is an isometric view of a proximity sensor in accordance with the invention;

FIG. 2 is a partial plan view of the proximity sensor to help explain the operation;

FIG. 3A is a plan view of the sensor with two different targets;

FIG. 3B is a graph of sensor voltages;

DESCRIPTION OF THE PREFERRED EMBODIMENTS

Figure 4A:
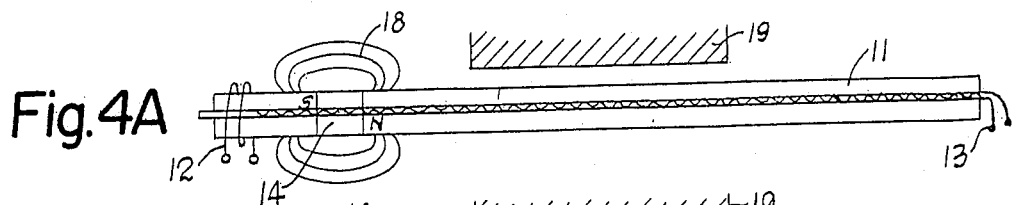
FIGS. 4A-4H are plan views of the proximity sensor showing a sequence of positions of the strain wave relative to a target.
Figure 4B:
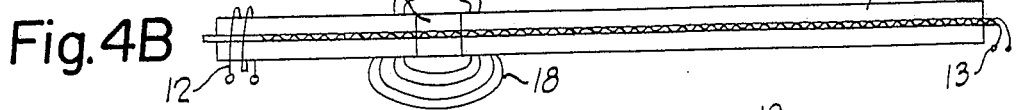

FIG. 1 illustrates the key elements of a magnetoacoustic proximity sensor 10. An elongated magnetostrictive member 11 has a given length, width, and thickness. It is shown as a rod or wire of magnetostrictive material, such as nickel, and the wire has a length which is long relative to its thickness. The magnetostrictive member 11 has been longitudinally magnetized. This may be from an external magnetic field provided by a DC coil, or as shown, provided by a permanent magnet 16. In one particular example, the nickel wire is 99.9% pure and has a diameter of 0.05" and a length of 18". In the preferred embodiment, this nickel wire was heat treated by passing a current through it while the wire was under tension, which served to straighten the wire, provided more uniform sensing, and helped prevent the excitation of unwanted modes.

Pulsing means 12 is provided to establish a magnetic stress near one end of the wire, and hence a strain wave which will propagate along the wire. This is provided in this embodiment by a transducer coil or pulsing coil 12, which may be a single layer coil 12 consisting of 50 turns of #38 wire closewound over the nickel wire and placed near one end. The exact position of the transducer coil was adjusted to optimize the shape of the resulting signal, and was about one-tenth of an inch from the end of the nickel wire. If the coil was too near the end of the wire, the signal amplitude was reduced. If it was too far away, the signal was broadened, resulting in decreased time resolution. The transducer coil is excited by a short pulse of current. The magnetic field in the region of the transducer coil is disturbed by the current pulse and a local variation in the strain is created by magnetostriction. This strain wave 14 propagates down the wire at the longitudinal mode sound velocity, Vs, which is about 200,000 inches per second. The situation shown in FIG. 1 is for a time $T=D/V_s$ after the initiation of the pulse. In this time, the strain disturbance has propagated a distance D. The strain disturbance is shown exaggerated as a sine wave change in shape. An elongated conductive pickup member 13 has the length thereof parallel to, close to, and generally coextensive with the wire 11. This pickup member is at least two coil sides of a pickup coil, and the wire 11 is positioned to lie in the plane of the extended pickup coil 13. This coil is preferably a multi-turn coil to increase the signal, has an axis 17 perpendicular to the mid area of the member 11, and detects changes in the flux passing through it.

FIG. 2 is an enlargement of the nickel wire 11 and showns diagrammatically the strain wave 14. The magnetostrictive property of the wire creates a small perturbation in the static magnetic field 15. This perturbation is equivalent to a dipole magnet with flux lines 18 and serves to excite the space surrounding the magnetostrictive wire.

A side view of a typical sensing arrangement is shown in FIG. 3A. The magnetostrictive wire 11 is excited by a current pulse in coil 12. Sensor coil 13 measures the change in flux passing through it. In this example, a conductive aluminum target 19 and a nonconducting magnetic target 20 (ferrite) are near the magnetoacoustic proximity sensor. Each target is a flux distorting material, and the conductive target need not be a solid sheet. It may be a conductive closed loop, for example. As the coupled strain wave 14 and traveling magnetic field 18 pass each object, the local flux is changed and voltage is induced in 13. In target 19, eddy currents induced in the aluminum tend to cancel the flux and induce a voltage opposite to magnetic target 20, where the flux in the target is enchanced due to its high magnetic permeability. The type of target can be uniquely identified by observing on an oscilloscope the sign of the induced signal. The location of the targets can be determined by measuring the time intervals $T_A$ and $T_F$ and multiplying by the sound velocity. While the magnetoacoustic strain wave is within a region where the target spacing and target material properties are constant, there is no change in the flux passing through coil 13 during successive time increments and no voltage is induced in the sensor coil. This is more clearly illustrated in FIG. 4, which qualitatively shows the interaction of an aluminum target with a passing magnetoacoustic wave.

Figure 4C:
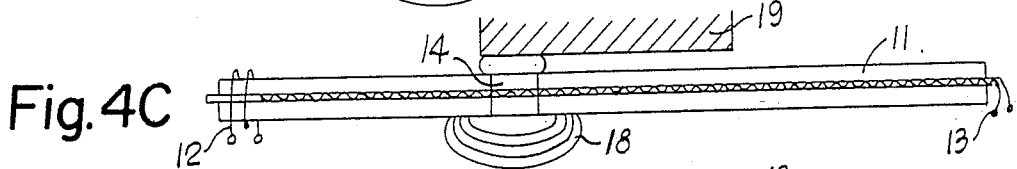
Figure 4D:
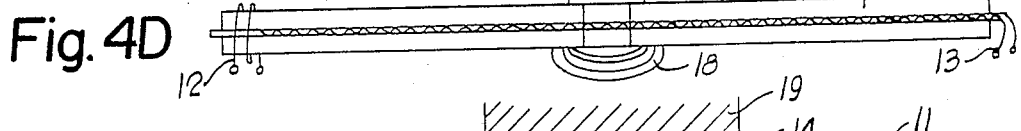
Figure 4E:
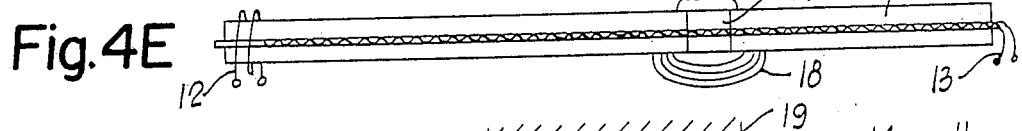
Figure 4F:
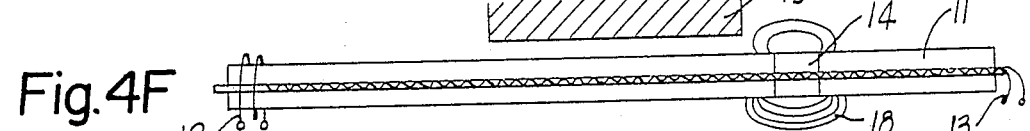
Figure 4G:
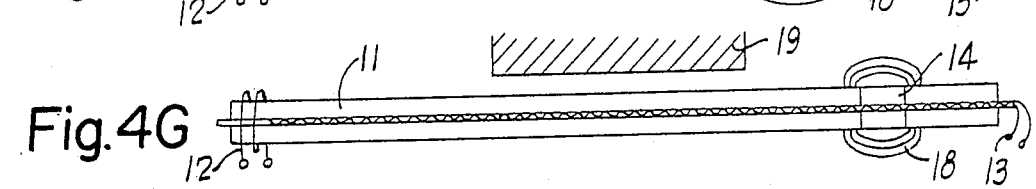
Figure 4H:
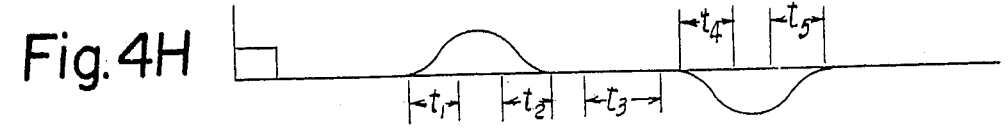

In FIG. 4A, shortly after the initiation of the strain wave by a current pulse in 12, no voltage is induced in the sensor coil 13, since the target is far away. The FIG. 4B, eddy currents in the aluminum target due to the field 18 have partially nullified the field and created relatively more flux below the plane of the sensor coil 13 than above. The corresponding induced voltage is rising in FIG. 4H, interval $t_1$. In FIG. 4C, the maximum change in flux has been reached, corresponding to the decreasing induced voltage shown in FIG. 4H, interval $t_2$. In FIG. 4D, the target spacing is constant and no change in flux is occurring, resulting in zero net voltage induced during interval $t_3$. In FIG. 4E, interval $t_4$, the dipole is beginning to emerge from the target area, permitting the flux above the plane of the sensor coil to increase again, inducing a voltage opposite to that in $t_1$ and $t_2$. In FIG. 4F, interval $t_5$, the flux above the plane is near maximum again, resulting in a decreasing induced voltage. In FIG. 4G, the dipole is too far from the target to have its external field influenced and the induced voltage is zero. If the same target approaches the nickel wire 11 from the side opposite that shown, then the sign of the signal in the oscilloscope is reversed. Thus, if the side of the wire that the target 13 is on is known, the sign of the oscilloscope signal will inform the observer as to whether the target is metallic or magnetic. Conversely, if the target composition is known, then the sign of the oscilloscope signal will inform the observer as to whether the target is on one side or the other of the wire 11. Another way to view the operation of the sensor is to imagine the traveling dipole magnet as the source of flux created by the moving primary of a transformer. The secondary of the transformer is the pickup coil 13. When the moving primary coil approaches the target material, the effective coupling between the primary and secondary is changed, and a voltage is induced in the secondary pickup coil.

Figure 5A:
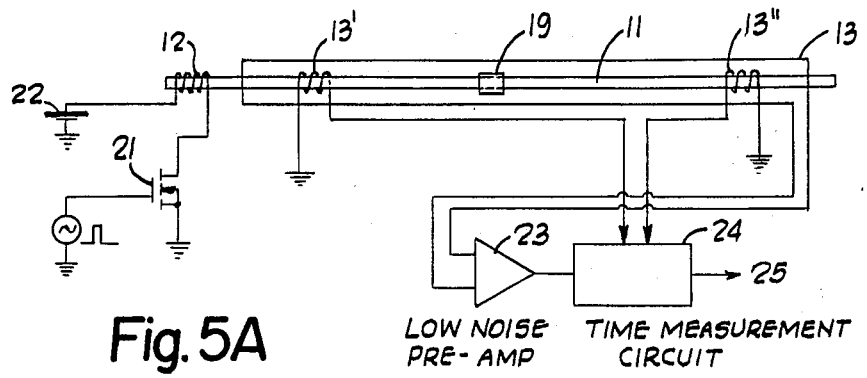
FIG. 5A is a plan view of a modified form of the invention.
Figure 5B:
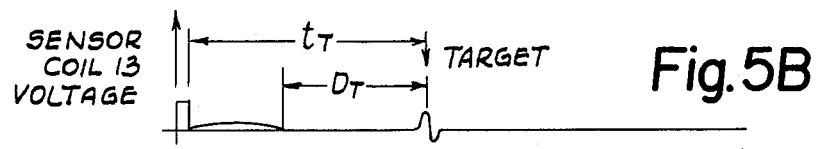
FIGS. 5B and 5C are graphs of voltages obtained in the proximity sensor of FIG. 5A.
Figure 5C:
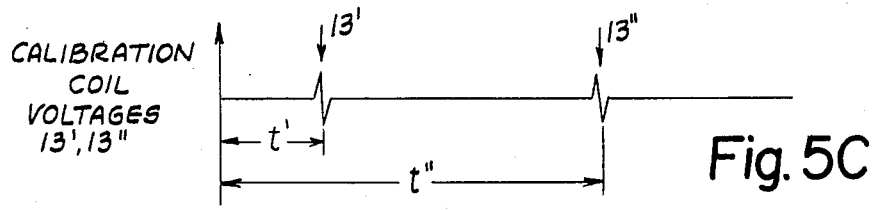

FIG. 5A shows the top view of a typical measurement system. The coil 12 (50 turns #38 single layer, closewound) is energized by a 2 μsec pulse of current from a power MOSFET 21 (IRF731) with a current of 15 amperes. An 80-volt supply 22 is connected to the coil 12. A signal is induced in the sensor coil 13 when the magnetoacoustic wave passes the target 19. Additionally, signals are induced at different times in calibration coils 13' and 13". Coils 13' and 13" are wound on the nickel wire at predetermined fixed points. The purpose of coils 13' and 13" is to render the measurement insensitive to changes in the temperature (and sound velocity) of the nickel wire. This is accomplished by relating the target distance to the calibration distance 13'-13". A low noise FET preamplifier 23 enhances the signal-to-noise ratio at the output of the sensor coil while a time measurement circuit 24 computes the distance $D_T$, FIG. 5B, from the time inputs $t_T, t'$ and $t''$, FIG. 5C. The digital outut 25 is then measured relative to reference point 13' and normalized to the spacing 13'-13".

Figure 6:
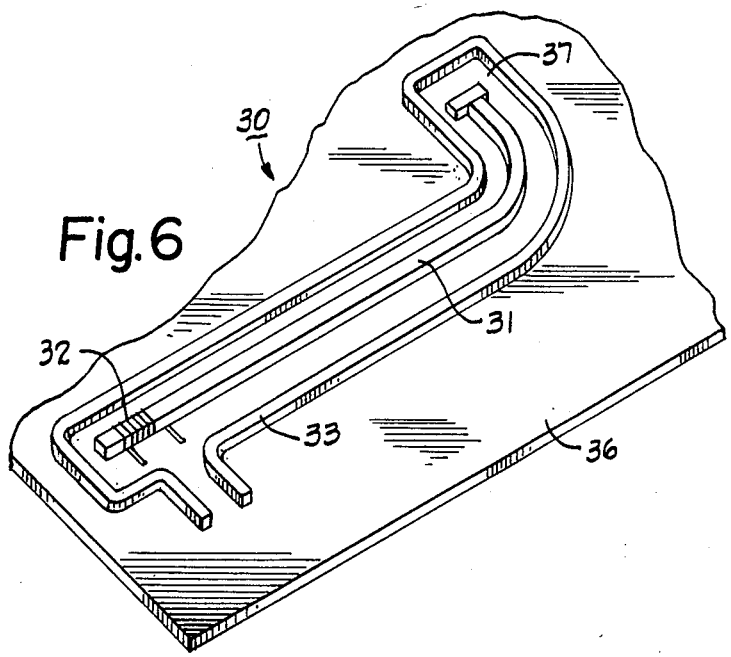
FIG. 6 is an isometric view of a further modification.

It is clear that there are many other embodiments of this invention. For example, torsional or surface waves could be employed instead of the longitudinal wave described here. Furthermore, the acoustic waveguide 11 need not be a circular cylinder as described in this disclosure. FIG. 6 illustrates a magnetoacoustic proximity sensor 30 constructed using planar technology. The magnetoacoustic waveguide 31, the excitation coil 32, and sensor coil 33 are deposited onto a suitable substrate 36 using well-known techniques of photolithography, etching, and plating. The acoustic waveguide need not be straight, but may be curved, or even form a closed path. The excitation need not be from a pulse of current in a coil but may be from a piezoelectric transducer 37 mechanically coupled to the waveguide.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of the circuit and the combination and arrangement of circuit elements may be resorted to without departing from the spirit and the scope of the invention as hereinafter claimed.

What is claimed is:

1. A magnetoacoustic proximity sensor comprising, in combination:
   an elongated magnetostrictive member having a given length, width, and thickness and wherein the length is long relative to its thickness:
   pulsing means to establish a strain wave traveling lengthwise through said magnetostrictive member and a magnetic field surrounding and concurrently traveling lengthwise of said magnetostrictive member;
   an elongated conductive pickup member positioned with the length thereof substantially coextensive with the length of said elongated magnetostrictive member;
   said pickup member having at least two coil sides disposed generally on opposite sides and following the length of said magnetostrictive member:
   each increment of length of said coil sides being substantially parallel to the corresponding increment along the length of said magnetostrictive member;
   said pickup member being positioned within said traveling magnetic field; and
   detector means connected to said pickup member to detect the presence and location of a target of flux distorting material adjacent said magnetostrictive member and within said traveling magnetic field at any distance along the length of said magnetostrictive member by using the velocity of the traveling magnetic field and the time interval between the pulsing means and the signal in the detector means resulting from the disturbance of the traveling magnetic field caused by the target.

2. A magnetoacoustic proximity sensor as set forth in claim 1, including means to establish a static magnetic field within said elongated magnetostrictive member.

3. A magnetoacoustic proximity sensor as set forth in claim 1, wherein said magnetostrictive member is magnetized lengthwise.

4. A magnetoacoustic proximity sensor as set forth in claim 1, wherein said elongated pickup member includes means to form a conductive closed loop for flow of electrical current.

5. A magnetoacoustic proximity sensor as set forth in claim 1, wherein said elongated pickup member lies substantially in the plane of said magnetostrictive member.

6. A magnetoacoustic proximity sensor as set forth in claim 1, wherein said elongated pickup member is a pickup coil positioned to embrace at least substantially all of said given length.

7. A magnetoacoustic proximity sensor as set forth in claim 6, wherein said pickup coil is a multi-turn coil.

8. A magnetoacoustic proximity sensor as set forth in claim 6, wherein said pickup coil is a flat coil lying substantially in the plane of said magnetostrictive member.

9. A magnetoacoustic proximity sensor as set forth in claim 6, wherein said pickup coil has an axis substantially perpendicular to the midpoint of said magnetostrictive member.

10. A magnetoacoustic proximity sensor as set forth in claim 6, wherein said two coil sides of said pickup coil are disposed substantially equidistant from said magnetostrictive member.

11. A magnetoacoustic proximity sensor as set forth in claim 1, wherein said pulsing means includes a coil surrounding said magnetostrictive member near one end thereof.

12. A magnetoacoustic proximity sensor as set forth in claim 1, wherein said flux distorting target is of electrically conductive material.

13. A magnetoacoustic proximity sensor a set forth in claim 1, wherein said flux distorting target is of magnetizable material.

* * * * *